(12) United States Patent
Lang

(10) Patent No.: US 8,646,675 B2
(45) Date of Patent: Feb. 11, 2014

(54) LAYING APPARATUS, CONTACT-MAKING APPARATUS, MOVEMENT SYSTEM, LAYING AND CONTACT-MAKING UNIT, PRODUCTION SYSTEM, METHOD FOR PRODUCTION AND A TRANSPONDER UNIT

(75) Inventor: Ulrich Lang, Marktoberdorf (DE)

(73) Assignee: HID Global GmbH, Walluf (DE)

( * ) Notice: Subject to any disclaimer, the term of this patent is extended or adjusted under 35 U.S.C. 154(b) by 770 days.

(21) Appl. No.: 11/718,512

(22) PCT Filed: Oct. 27, 2005

(86) PCT No.: PCT/DE2005/001932
§ 371 (c)(1),
(2), (4) Date: Apr. 30, 2008

(87) PCT Pub. No.: WO2006/050691
PCT Pub. Date: May 18, 2006

(65) Prior Publication Data
US 2009/0033585 A1 Feb. 5, 2009

(30) Foreign Application Priority Data

Nov. 2, 2004 (DE) .......................... 10 2004 053 388
Jun. 20, 2005 (DE) .......................... 10 2005 028 467

(51) Int. Cl.
*B23K 37/00* (2006.01)
(52) U.S. Cl.
USPC ........................................ 228/4.5; 228/180.5
(58) Field of Classification Search
USPC ................................. 228/180.5, 4.5
See application file for complete search history.

(56) References Cited

U.S. PATENT DOCUMENTS

| 3,116,889 A | 1/1964 | Lasch et al. |
| 3,384,283 A | 5/1968 | Mims |
| 3,674,602 A | 7/1972 | Keogh et al. |
| 3,674,914 A | 7/1972 | Burr |
| 3,917,148 A | 11/1975 | Runyon |
| 4,437,603 A | 3/1984 | Kobayashi et al. |

(Continued)

FOREIGN PATENT DOCUMENTS

| AU | 720773 | 6/2000 |
| CA | 2348461 | 5/2000 |

(Continued)

OTHER PUBLICATIONS

European Search Report and Written Opinion, Reference No. E87054 EP (GS/, Application No. 07018301.7, Aug. 2, 2008; 6 pgs.

(Continued)

*Primary Examiner* — Maria Veronica Ewald
*Assistant Examiner* — Megha Mehta
(74) *Attorney, Agent, or Firm* — Sheridan Ross P.C.

(57) ABSTRACT

The invention relates to a laying device which is used to lay wire windings on transponder units, wherein the wire is guided in an axial manner in the laying device, a contacting device is used place the wires in contact with an automatic thermal clamping arrangement, an advancing system is used to advance machining devices by means of a piezo-leg-motor, a production system is used to produce transponder units in a console structural manner. The invention also relates to a method for the production of transponder units with horizontal ultrasonic introduction and a transponder unit wherein the wire ends engage directly on the ends of the connection surfaces of the chip.

7 Claims, 9 Drawing Sheets

(56) References Cited

U.S. PATENT DOCUMENTS

Figure 1:
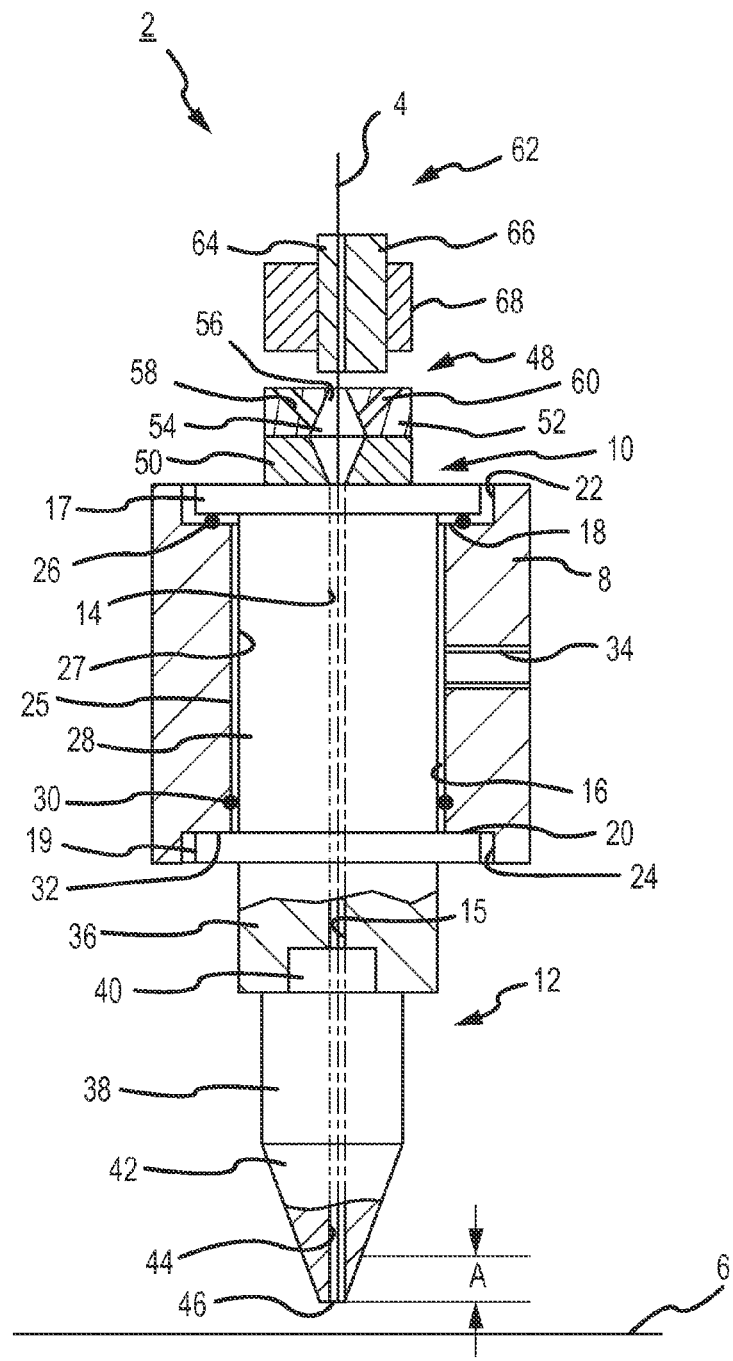

| | | |
|---|---|---|
| 4,450,623 A | 5/1984 | Burr |
| 4,641,773 A | 2/1987 | Morino et al. |
| 4,642,321 A | 2/1987 | Schoenberg et al. |
| 4,693,778 A | 9/1987 | Swiggett et al. |
| 4,711,026 A | 12/1987 | Swiggett et al. |
| 4,791,285 A | 12/1988 | Ohki |
| 4,861,533 A | 8/1989 | Bertin et al. |
| 4,912,143 A | 3/1990 | Ahn et al. |
| 5,008,619 A | 4/1991 | Keogh et al. |
| 5,041,826 A | 8/1991 | Milheiser |
| 5,094,907 A | 3/1992 | Yamamura et al. |
| 5,186,776 A | 2/1993 | Boyce et al. |
| 5,201,453 A | 4/1993 | Amador et al. |
| 5,281,855 A | 1/1994 | Hadden et al. |
| 5,288,008 A | 2/1994 | Haji et al. |
| 5,294,290 A | 3/1994 | Reeb |
| 5,365,657 A | 11/1994 | Brown et al. |
| 5,377,894 A | 1/1995 | Mizoguchi et al. |
| 5,393,001 A | 2/1995 | Gustafson |
| 5,531,390 A | 7/1996 | Gustafson |
| 5,535,043 A * | 7/1996 | La Fiandra et al. ........ 359/224.1 |
| 5,606,488 A | 2/1997 | Gustafson |
| 5,649,352 A | 7/1997 | Gustafson |
| 5,770,807 A | 6/1998 | Finn et al. |
| 5,773,812 A | 6/1998 | Kreft |
| 5,809,633 A | 9/1998 | Mundigl et al. |
| 6,008,993 A | 12/1999 | Kreft |
| 6,023,837 A | 2/2000 | Finn |
| 6,055,720 A | 5/2000 | Finn et al. |
| 6,067,235 A | 5/2000 | Finn et al. |
| 6,088,230 A | 7/2000 | Finn et al. |
| 6,095,423 A | 8/2000 | Houdeau et al. |
| 6,102,275 A | 8/2000 | Hill et al. |
| 6,142,381 A | 11/2000 | Finn et al. |
| 6,152,348 A | 11/2000 | Finn et al. |
| 6,173,879 B1 | 1/2001 | Chiba |
| 6,190,942 B1 | 2/2001 | Wilm et al. |
| 6,233,818 B1 | 5/2001 | Finn et al. |
| 6,288,443 B1 | 9/2001 | Finn et al. |
| 6,295,720 B1 | 10/2001 | Finn et al. |
| 6,310,778 B1 | 10/2001 | Finn et al. |
| 6,313,566 B1 * | 11/2001 | Cunningham et al. ........ 310/328 |
| 6,351,525 B1 | 2/2002 | Rodriguez |
| 6,471,878 B1 | 10/2002 | Greene et al. |
| 6,491,202 B1 | 12/2002 | Kyomasu et al. |
| 6,521,829 B2 | 2/2003 | Matsumura et al. |
| 6,604,686 B1 | 8/2003 | Taban |
| 6,626,364 B2 | 9/2003 | Taban |
| 6,628,240 B2 | 9/2003 | Amadeo |
| 6,662,430 B2 | 12/2003 | Brady et al. |
| 6,698,089 B2 | 3/2004 | Finn et al. |
| 6,779,348 B2 | 8/2004 | Taban |
| 6,810,580 B2 | 11/2004 | Yamaguchi et al. |
| 6,870,497 B2 | 3/2005 | Kondo et al. |
| 6,897,090 B2 | 5/2005 | DiStefano et al. |
| 7,059,535 B2 | 6/2006 | Rietzler |
| 7,105,915 B1 | 9/2006 | Finn et al. |
| 7,229,022 B2 | 6/2007 | Rietzler |
| 2002/0020903 A1 | 2/2002 | Kreft et al. |
| 2002/0027152 A1 | 3/2002 | Ushiki et al. |
| 2002/0060239 A1 * | 5/2002 | Or et al. ..................... 228/180.5 |
| 2006/0208066 A1 | 9/2006 | Finn et al. |

FOREIGN PATENT DOCUMENTS

| | | |
|---|---|---|
| CA | 2555034 | 9/2005 |
| DE | 3805584 | 8/1989 |
| DE | 4205084 | 9/1993 |
| DE | 4329708 | 3/1995 |
| DE | 4332055 | 3/1995 |
| DE | 4408124 | 9/1995 |
| DE | 4446289 | 6/1996 |
| DE | 19541039 | 5/1997 |
| DE | 19619771 | 8/1997 |
| DE | 19610507 | 9/1997 |
| DE | 19616424 | 10/1997 |
| DE | 19620242 | 11/1997 |
| DE | 19713634 | 11/1997 |
| DE | 19634473 | 1/1998 |
| DE | 19634661 | 3/1998 |
| DE | 19646717 | 5/1998 |
| DE | 19716912 | 11/1998 |
| DE | 19741984 | 6/1999 |
| DE | 19751043 | 6/1999 |
| DE | 19822383 | 12/1999 |
| DE | 19903784 | 8/2000 |
| DE | 19946254 | 4/2001 |
| DE | 19934789 | 5/2001 |
| DE | 10009456 | 9/2001 |
| DE | 102004010013 | 9/2004 |
| DE | 102004011929 | 9/2005 |
| DE | 202005016382 | 2/2006 |
| DE | 102004043747 | 3/2006 |
| DE | 102004045896 | 3/2006 |
| EP | 0133820 | 3/1985 |
| EP | 0212238 | 3/1987 |
| EP | 0217019 | 4/1987 |
| EP | 0227002 | 7/1987 |
| EP | 0276928 | 8/1988 |
| EP | 0481776 | 4/1992 |
| EP | 0593966 | 4/1994 |
| EP | 0692770 | 1/1996 |
| GB | 1352557 | 5/1974 |
| GB | 1593235 | 7/1981 |
| GB | 2180175 | 3/1987 |
| GB | 2180408 | 3/1987 |
| JP | 062008313 | 1/1987 |
| JP | 01264234 | 10/1989 |
| JP | 06351194 | 12/1994 |
| JP | 9507727 | 8/1997 |
| WO | WO 91/16718 | 10/1991 |
| WO | WO 93/20537 | 10/1993 |
| WO | WO 94/28562 | 12/1994 |
| WO | WO 95/03685 | 2/1995 |
| WO | WO 95/26538 | 10/1995 |
| WO | WO 95/32073 | 11/1995 |
| WO | WO 96/07984 | 3/1996 |
| WO | WO 96/13793 | 5/1996 |
| WO | WO 96/22608 | 7/1996 |
| WO | WO 96/29618 | 9/1996 |
| WO | WO 97/04415 | 2/1997 |
| WO | WO 97/11437 | 3/1997 |
| WO | WO 97/17191 | 5/1997 |
| WO | WO97/30148 | 8/1997 |
| WO | WO 97/30418 | 8/1997 |
| WO | WO 97/35273 | 9/1997 |
| WO | WO 98/02848 | 1/1998 |
| WO | WO 98/09305 | 3/1998 |
| WO | WO 98/26453 | 6/1998 |
| WO | WO 00/26855 | 5/2000 |
| WO | WO 00/68994 | 11/2000 |
| WO | WO 01/08089 | 2/2001 |
| WO | WO 02/46896 | 6/2002 |
| WO | WO 02/077918 | 10/2002 |
| WO | WO 2004/006178 | 1/2004 |

OTHER PUBLICATIONS

AIT, Coil Manufacturing Technology, Sep. 1995, 6 pages.
AIT, CoilPro Wiring Systems, CoilPro 2000, date unknown, 1 page.
AIT, Embedded Wire Technology, date unknown, 1 page.
AIT, RFID Embedded Wire Technology, date unknown, 1 page.
International Search Report (including translation) for International (PCT) Patent Application No. PCT/DE2005/001932, mailed Jul. 31, 2006.
Written Opinion (including translation) for International (PCT) Patent Application No. PCT/DE2005/001932.
International Preliminary Report on Patentability (including translation) for International (PCT) Patent Application No. PCT/DE2005/001932.

* cited by examiner

LAYING APPARATUS, CONTACT-MAKING APPARATUS, MOVEMENT SYSTEM, LAYING AND CONTACT-MAKING UNIT, PRODUCTION SYSTEM, METHOD FOR PRODUCTION AND A TRANSPONDER UNIT

CROSS-REFERENCE TO RELATED APPLICATIONS

This application is a 371(c) National Stage of PCT/DE2005/001932 filed Oct. 27, 2005, which claims priority to German patent application Serial No. DE102004053388.1 filed Nov. 2, 2004 and German patent application Serial No. DE102005028467.1 filed Jun. 20, 2005, the disclosures of each of which are hereby incorporated by reference in their entireties.

The invention relates to a laying apparatus for laying of wire windings for transponder units, in particular for production of smart cards, to a contact-making apparatus for making contact with the wires, to a movement system for movement of processing apparatuses, to a laying and contact-making, to a production installation for production of transponder units, to a method for production of transponder units, and to a transponder unit.

By way of example, transponder units are used for smart cards such as biometric passes. They are used for storage and transmission of information, and essentially comprise a wire coil which is composed of individual wire windings and whose end sections are connected to a chip. The wire coil is used as an antenna for transmission of information on the chip. The transponder unit is normally fitted directly into a substrate. The wire is embodied into the substrate, or its end sections are connected to the chip, by application of ultrasound or by thermal welding.

In the case of known smart cards, the chips are arranged on a chip module in order to enlarge their connecting pads, and are positioned via this on the substrate.

Smart cards such as these have the disadvantage that the chip modules significantly increase the material costs.

An apparatus for production of a smart card such as this is disclosed in EP 0 880 754 B1. The laying apparatus has an ultrasound horn and an ultrasound converter for application of ultrasound oscillations to an insulated wire which is guided in the ultrasound horn. The oscillations heat the wire with its insulation, effectively "hammering" the wire into the substrate.

This solution has the disadvantage that the wire is inserted into the ultrasound horn at the side, which means that an inclined hole must be formed in the ultrasound horn in order to hold the wire, and the ultrasound horn has a complex geometry. In this case, the wire is threaded into the inclined hole manually, and this is correspondingly time-consuming and costly.

One known contact-making apparatus for connection of the end sections of the wire to the chip has a thermode which is heated and pressed against the end sections, so that the wire is welded to the chip by application of temperature and pressure to it. In this case, the thermode is arranged between the clamping bodies, which are stressed with respect to one another by means of clamping screws.

This solution has the disadvantage that the clamping screws must be released manually in order to replace the thermode.

Spindle motors are normally used for movement of a laying apparatus or a contact-making apparatus, and are connected to the respective apparatus via damping elements, in order to damp overshoots from the motors.

However, spindle motors have limited dynamics. In addition, the damping elements result in undesired oscillations being introduced into the movement system. Furthermore, spindle motors require a separate braking mechanism in order to prevent undesirable movements in the vertical direction, because of the force of gravity.

According to EP 0 880 754 B1, the wires in known methods for production of smart cards have vertical ultrasound oscillations applied to them while they are being laid on the substrate. This means that the ultrasound oscillations run in the longitudinal direction of the ultrasound horn which is carrying the wire.

However, these methods have the disadvantage that contamination, for example from the wire insulation, can also be "hammered" into the substrate.

For industrial production of smart cards, a plurality of laying apparatuses and contact-making apparatuses are combined in one production installation. Installations such as these are generally designed with a gantry-type construction. One known gantry-type construction is disclosed in EP 0 880 754 B1. The gantries essentially have two vertical supports, which are positioned on opposite longitudinal sides of a machine bed, and a transverse support, which connects the vertical supports to one another. The apparatuses are arranged alongside one another on the transverse supports, sorted into groups on the basis of the sequence of the process steps, and can be moved in the vertical direction by means of a vertical movement of the transverse support.

The gantry construction has the disadvantage that the accessibility and thus the capability to observe the production process are greatly restricted by the vertical supports. A further disadvantage is that any space which is made available on the transverse supports for attachment of the processing apparatuses is greatly restricted, so that the productivity is greatly restricted.

The object of the present invention is to provide a laying apparatus for the laying of wires for a transponder unit, a contact-making apparatus for making contact with the wires, a movement system for movement of processing apparatuses, a laying and contact-making unit, a production installation for production of transponder units, a method for production of transponder units and a transponder unit, which overcome the abovementioned disadvantages and allow safe and cost-effective manufacture.

A laying apparatus according to the invention has an ultrasound horn for laying the wire on a substrate, and has an ultrasound converter for application of ultrasound oscillations to the ultrasound horn. According to the invention, the wire can be supplied axially to the laying apparatus.

The axial wire supply has the advantage that there is no need to form an inclined hole in the ultrasound horn, and the ultrasound horn can be designed in a correspondingly simple manner. The simplified design of the ultrasound horn allows its weight to be reduced, thus allowing an increase in the ultrasound oscillations, for example from 40 kHz normally to about 60 kHz.

One preferred embodiment provides an axial passage channel for holding the wire, which passes axially through the laying apparatus.

In order to minimize the friction of the wire in the passage channel, the wire can be guided in the passage channel via an air bearing. For this purpose, a radial hole is provided in a wire insertion area of the passage channel for blowing in compressed air. In this case, it may be advantageous to heat the compressed air to about 50° C. to 60° C., in order to preheat the wire and its insulation, and to shorten the laying cycle time.

In order to improve the air bearing, one embodiment provides for the passage channel to taper radially in the head area of the ultrasound horn, in order to form a type of ram-air pressure. If, for example, the diameter of the passage channel is 3 mm, then it is preferably reduced in the head area over an axial length of about 2 mm to 3 mm, measured from its outlet opening, to about 300 µm.

In order to minimize the wear on the ultrasound horn at the outlet opening, it is advantageous for the ultrasound horn to be mounted in the laying apparatus such that it can rotate, so that the wire does not rest on one local area of the outlet opening, but comes into contact with a large number of local areas so that, during operation, the entire circumferential area of the outlet opening is loaded uniformly in places. Rotational movements such as these can be achieved by mounting the ultrasound converter in a floating manner, preferably by means of aerostatic guidance. In this case, the ultrasound converter can be designed to have two annular shoulders, which bound an annular space to which compressed air can be applied, preferably in the region of about 6 bar.

In order to automate the supply of the wire to the passage channel, a feed device can be provided which grips the end section of the wire to be inserted, and inserts it or threads it into the passage channel. In this case, one embodiment provides for the feed device to be designed like a gripper and to be moveable relative to the laying apparatus.

In principle, the ultrasound converter can be arranged as required with respect to the ultrasound horn. In one embodiment, it is positioned with its longitudinal axis coaxial with respect to the longitudinal axis of the ultrasound horn, with the passage channel extending through it. In another embodiment, it is arranged at the side of the ultrasound horn. The arrangement at the side has the advantage that the ultrasound horn can be designed to be even simpler, thus allowing the laying apparatus to be operated at even higher frequencies, for example beyond 100 kHz. In this case, with the arrangement at the side, the ultrasound waves are preferably introduced into the ultrasound horn transversely with respect to its longitudinal axis, that is to say in the horizontal direction.

In one preferred embodiment, the longitudinal axis of the ultrasound converter is arranged such that it is radially offset by an offset with respect to the longitudinal axis of a housing on which the ultrasound converter is mounted.

In another preferred embodiment, the wire can have its insulation removed from it within the laying apparatus.

A contact-making apparatus according to the invention for making contact with wires, in particular with chips, has a clamping arrangement for clamping a thermode. According to the invention, the clamping arrangement has clamping jaws which are prestressed automatically with respect to one another, so that the thermode is clamped in.

This solution has the advantage that there is no need for clamping screws, which have to be operated manually.

In one preferred embodiment, the clamping arrangement has a stationary and a moveable clamping jaw, with the moveable clamping jaw being in the form of a lever and being prestressed against the stationary clamping jaw by means of a spring. The spring is preferably supported on the stationary clamping jaw.

A moveable wedge element can be provided in order to release the clamp and can be brought into contact with a wedge surface on an inclined surface of the moveable clamping jaw, so that the moveable clamping jaw can be pivoted and the spring can be compressed by movement of the wedge element. This mechanism allows the thermode to be replaced automatically, and thus allows the time to replace the thermode and the shutdown time of the contact-making apparatus to be shortened. The thermodes can be kept available in a magazine which can be driven appropriately by the contact-making device in order to remove a new thermode.

Inert gas, which flows around the thermode tips during operation, can be used in order to improve the contact-making and in order to avoid dangerous gases while making contact. Inert-gas channels can be formed in the clamping jaws as the inert-gas supply and emerge from the clamping jaws in their head area, that is to say at an axial distance of about 1 mm from the thermode tip. The inert-gas supply can be optimized via a valve and a sensor for measurement of the inert-gas parameters, in particular the volume and the pressure. The inert gas can be sucked away via a cup-like suction shroud, whose interior the clamping jaws enter with the thermode.

A movement system according to the invention for the movement of processing apparatuses, such as the laying or contact-making apparatus according to the invention, has a connection carriage for connection of the processing apparatus, and a drive for movement of the connection carriage. According to the invention, the drive is a piezo-motor, which operates on the piezo-leg principle.

A movement system such as this has the advantage that it has very good dynamics. Furthermore, the movement system can be designed to be small and in a weight-saving manner since, for example, the self-locking of the piezo-motor means that there is no need for a separate braking mechanism when no current is flowing.

In one embodiment, the piezo-motor is designed with a large number of fingers, which follow an s-shaped path, ideally a sinusoidal curve, when current is flowing. In this case, at least one finger acts on a slide which interacts with the connection carriage and is preferably produced from ceramic. The movement of the fingers is transmitted to the slide, as a result of which it carries out a linear movement. For improved longitudinal guidance, a surface of the slide facing away from the fingers can rest on a guide shoulder, and its free end section can be attached to a guide carriage, which is connected to the connection carriage for the processing apparatus.

The guide carriage can be connected directly or indirectly to the connection carriage. If connected indirectly, a load gauge, in particular a force gauge, is preferably arranged between the two carriages and can be used to measure the movement of the slide, so that the control system for the piezo-motor can be acted on for regulation purposes. In addition, the load gauge can carry out damping tasks, thus compensating for overshooting of the piezo-motor within certain limits, preferably up to 100 µm. It is thus possible to dispense with a known damping by means of a spring element, thus avoiding negative oscillations and the capability to transmit the good dynamics of the piezo-motor to the connection carriage.

A laying and contact-making unit according to the invention has a laying apparatus according to the invention and a contact-making apparatus according to the invention. The spatial combination of the laying apparatus with the contact-making apparatus has the advantage that two processes can be carried out in a space-saving manner.

In one preferred embodiment, the laying apparatus and the contact-making apparatus are arranged in a common holder, which can be moved in the x direction and in the y direction via two movement systems according to the invention. In this case, the expression in the x direction means movement in the longitudinal direction of a machine bed, and in the y direction means movement on the plane transversely with respect to the longitudinal direction of the machine bed. For movement in the z direction, that is to say in the vertical direction, the apparatuses can preferably be arranged individually on in each case one movement system according to the invention.

A production installation according to the invention, in particular for production of smart cards, provides a placement station for population of the substrate with a chip, a laying station for laying of a wire on a substrate, and a contact-making station for making contact between the wire and the chip. According to the invention, the stations are arranged on consoles which can be moved individually in the x, y and z directions.

In comparison to the known solutions, such as the gantry construction mentioned initially, this console construction has the advantage that it improves the accessibility and the capability for observation, since no vertical supports block the space on the machine bed and the view. The cycle time is preferably about 10 s.

In one preferred embodiment, the consoles are arranged on one longitudinal side of a machine bed and are designed in the form of cruciform slots, so that they can be moved via known spindle or linear drives. The individual stations comprise a large number of known placement apparatuses, the laying apparatuses according to the invention, and the contact-making apparatuses according to the invention.

However, of course, the laying station can also be combined with the contact-making station on one console to form a laying and contact-making station unit. A station unit such as this is then formed by a large number of laying and contact-making units according to the invention, in which case one laying and contact-making station unit such as this will be connected downstream from the placement station.

The productivity of the production installation can be improved if the individual apparatuses are positioned on the consoles not only alongside one another but flat, that is to say both alongside one another and one behind the other, in contrast to the known gantry construction. For example, about ten apparatuses can thus in each case form one station.

The individual apparatuses can be moved in the z direction via individual movement systems according to the invention.

A film stamping station can be provided for stamping chip windows into the substrate and can be moved on the machine bed in the x direction. The film stamping station is preferably in the form of a window stamp, which complies with very stringent accuracy requirements.

A cutting station can likewise be provided for subdivision of the substrates, which are provided with the transponder unit, into processing units which can be handled. The cutting station can be moved in the x direction on the machine bed, and is equipped with an ultrasound gauge for optimization of a sectional view. The flexibility of the overall production installation can be increased by the cutting station being freely programmable in such a manner that roll-sheet and roll-roll processing are/is possible without conversion.

In order to improve the adhesion of the laid wire windings on the films or the blanks, a coating station can be provided for application of a coating to at least those surface areas of the film or of the blank into which the wire windings are introduced.

In another preferred embodiment, the transponder units can be manufactured from individual sheets, which can be supplied manually to the production installation and can then be removed manually again after processing. This embodiment is particularly suitable for small batches, and allows individual fitting of the transponder units. For this purpose, the production installation may have at least one carriage for holding a sheet which is to be fitted, which carriage is guided on the machine bed such that it can be moved and moved towards the individual consoles. A return guide can be provided for returning the carriage, by means of which the carriage can be guided back to its initial position, that is to say the position in which the sheet to be processed has been placed on the carriage, so that it is possible for an operator to remove the populated sheet from the carriage that has been moved back, and to place a new sheet on this carriage. The return guide is advantageously arranged in a machine bed, so that the return guide does not require any additional space alongside the production installation.

In order to prevent the sheet from sliding on the carriage, a mechanical clamping device or a magnetic clamping device can be provided for clamping the sheet on the carriage.

In another embodiment, both a mechanical clamping device and the magnetic clamping device are provided, and act on edge areas of the sheet which are at a distance from one another. In this case, the edge areas preferably extend in the carriage feed direction.

The mechanical clamping device can be fixed in position on the carriage and may have a clamping jaw which is spring-preloaded in the clamping position.

The magnetic clamping device may have a clamping strip, which can be positioned as desired on the carriage and has a magnetic strip.

A method according to the invention for production of a transponder unit provides for ultrasound waves which run parallel to the laying plane to be applied to the wire when it is being laid on the substrate. This means that the ultrasound waves are introduced into the wire in the horizontal direction with respect to the longitudinal axis of the ultrasound horn which is supplying the wire.

This solution has the advantage that the wire is "rubbed" into the substrate thus removing contamination, for example its insulation, and correspondingly improving the laying quality. Furthermore, tool costs can be reduced.

The horizontal application of oscillations is preferably used when making direct contact. When making direct contact, the end sections of the wire are connected directly to connecting pads on the chip. This means that there is no need for the normal chip modules in order to enlarge the connecting pads.

A transponder unit according to the invention which has been produced by direct contact is distinguished, because of the direct contact and the lack of the chip module, by a reduced number of parts and reduced production costs.

One embodiment of direct contact provides for the chip to be positioned in a chip window in a substrate. An end section of the wire is then introduced into the substrate by application of ultrasound, with the wire being guided over a first connecting pad on the chip. After crossing over the chip, the wire is connected by thermal welding to the first connecting pad on the chip. The process of laying the wire with the application of ultrasound is continued until the desired wire coil has been formed on the substrate, with the wire finally crossing the laid wiring windings and being guided over a second connecting pad on the chip. In order to make contact between the wire and the second connecting pad, the wire is welded to it.

One preferred frequency range for the ultrasound oscillations is about 100 kHz.

The application of ultrasound can be stopped on crossing the laid wiring windings and/or on crossing over the connecting pads.

In order to cut through the wire after it has been welded to the second connected pad, the wire can carry out a pulling-back movement, which results in it being broken in the area of the weld. The pulling-back movement can be simplified by means of the feed device according to the invention.

A laying and contact-making unit according to the invention can be used as a preferred laying apparatus and/or contact-making apparatus.

Other advantageous embodiments are the subject matter of further dependent claims.

Figure 1A:
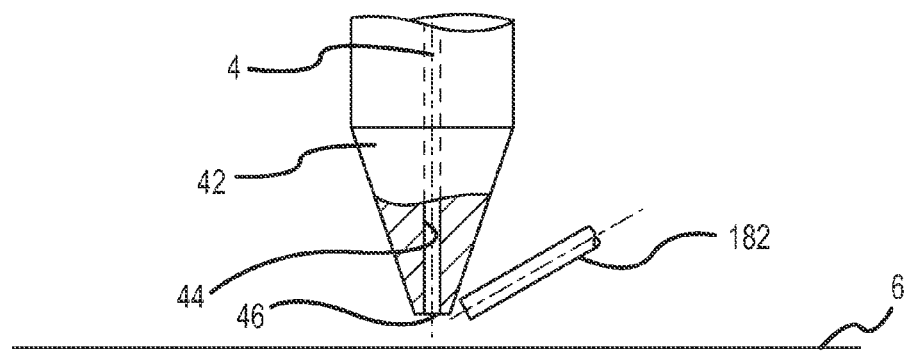
Figure 1B:
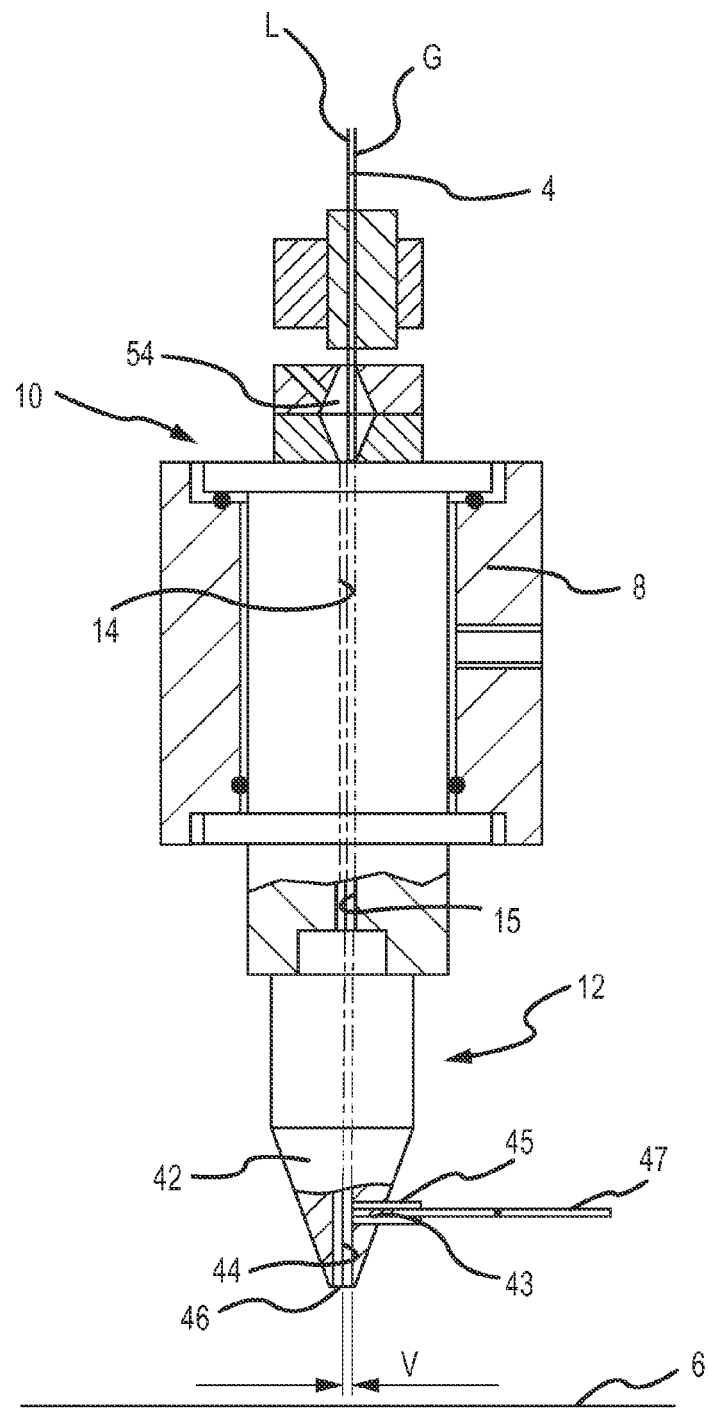
Figure 2:
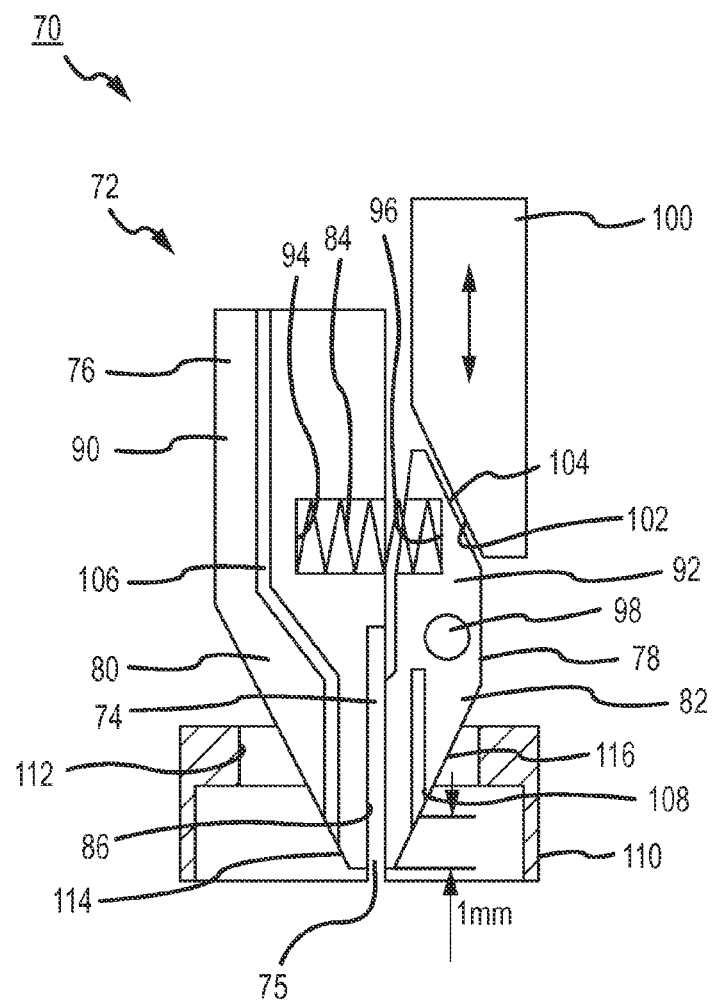
Figure 3:
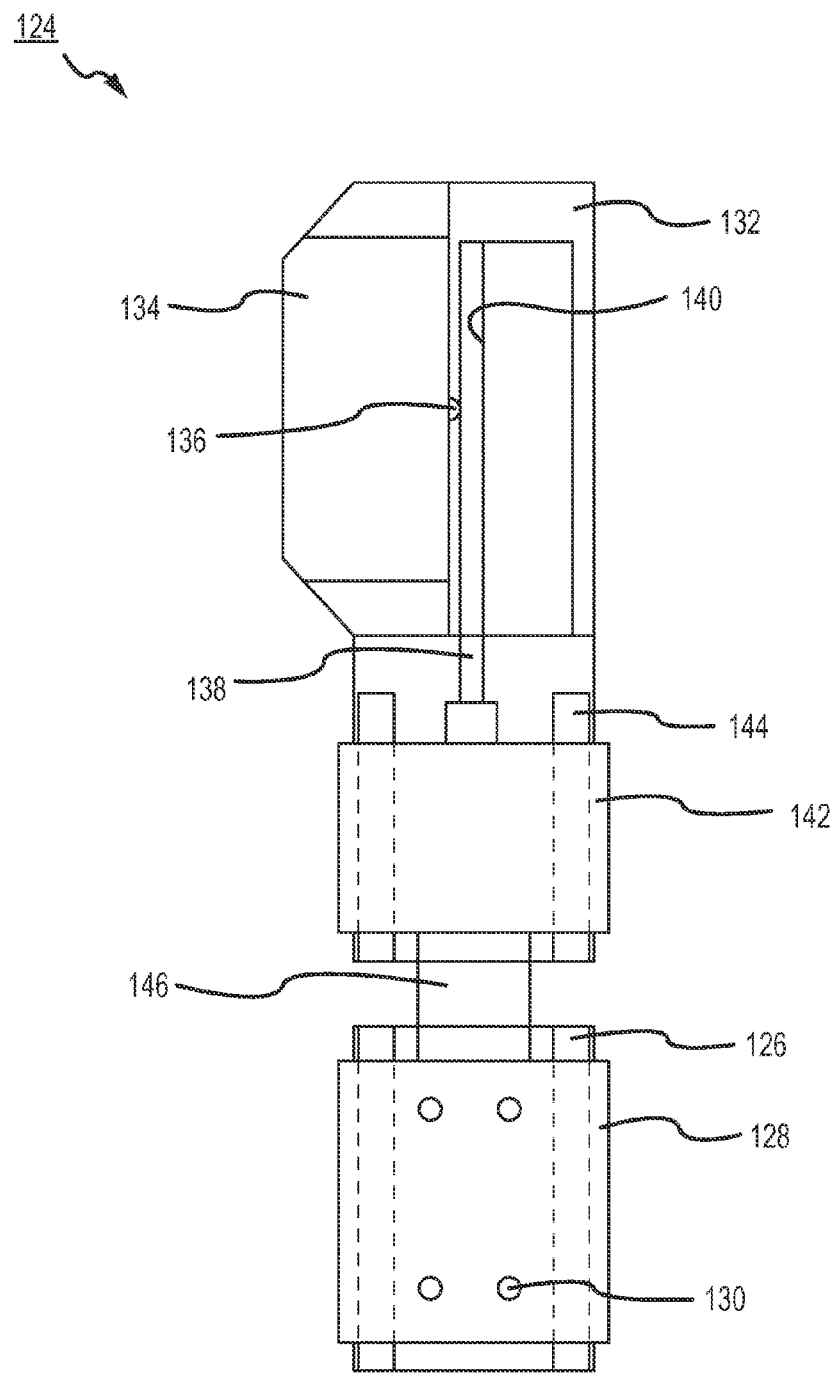
Figure 4:
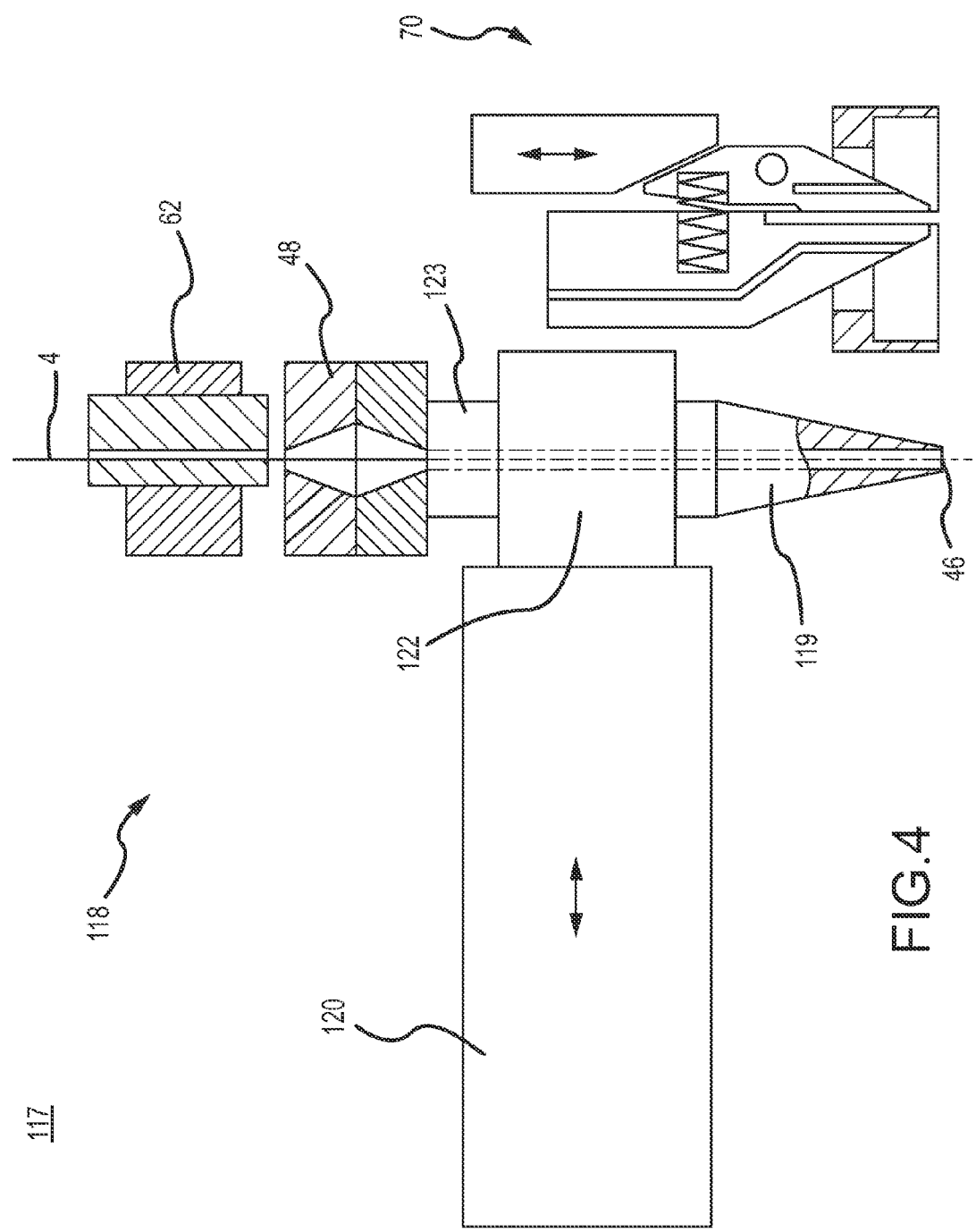
Figure 5:
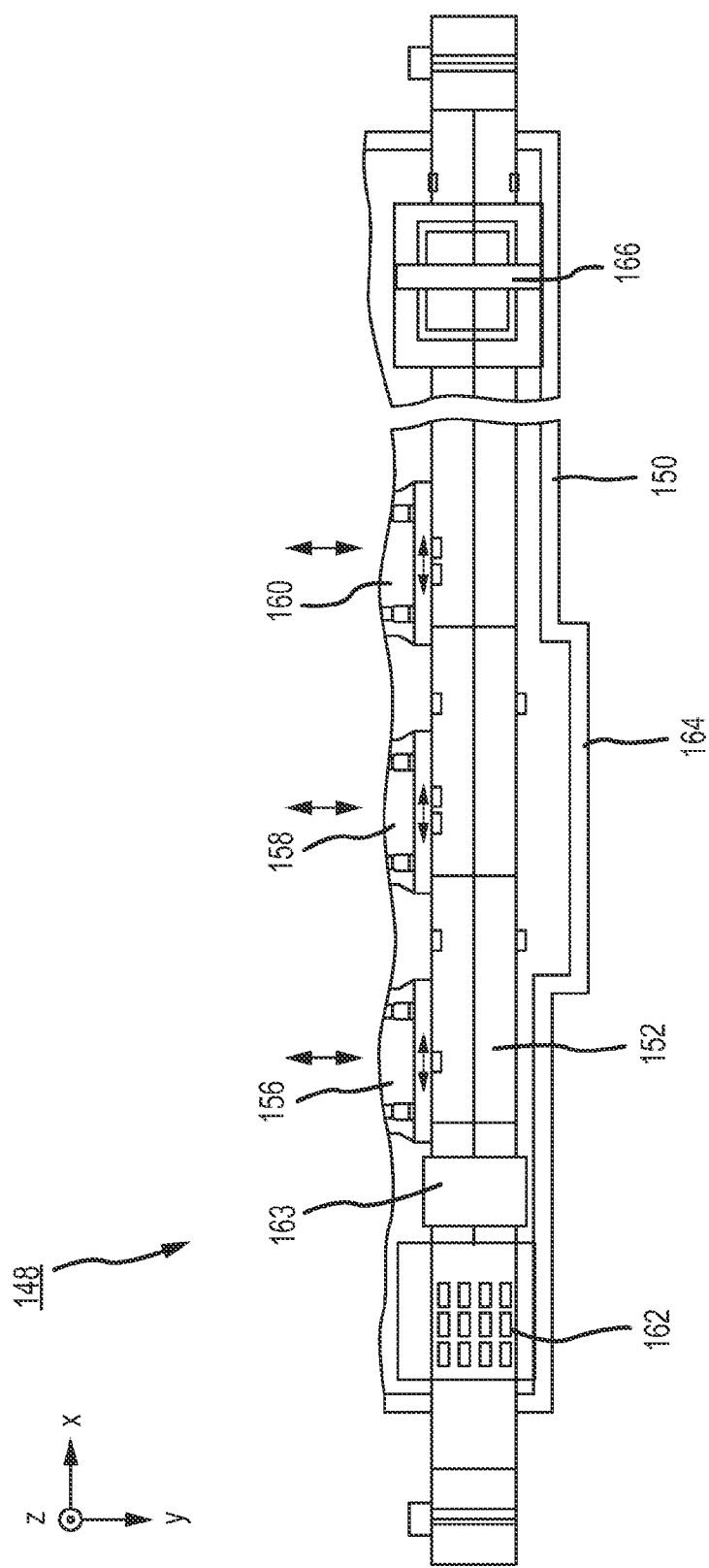
Figure 6:
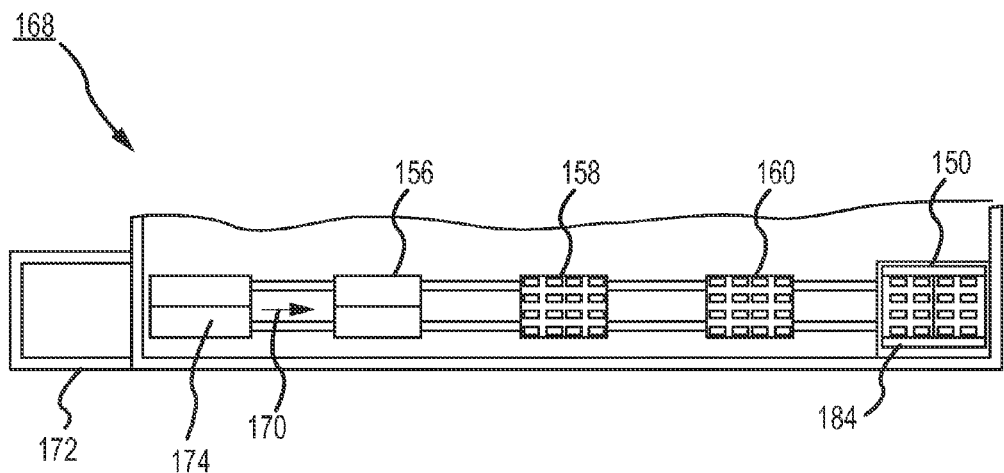
Figure 7:
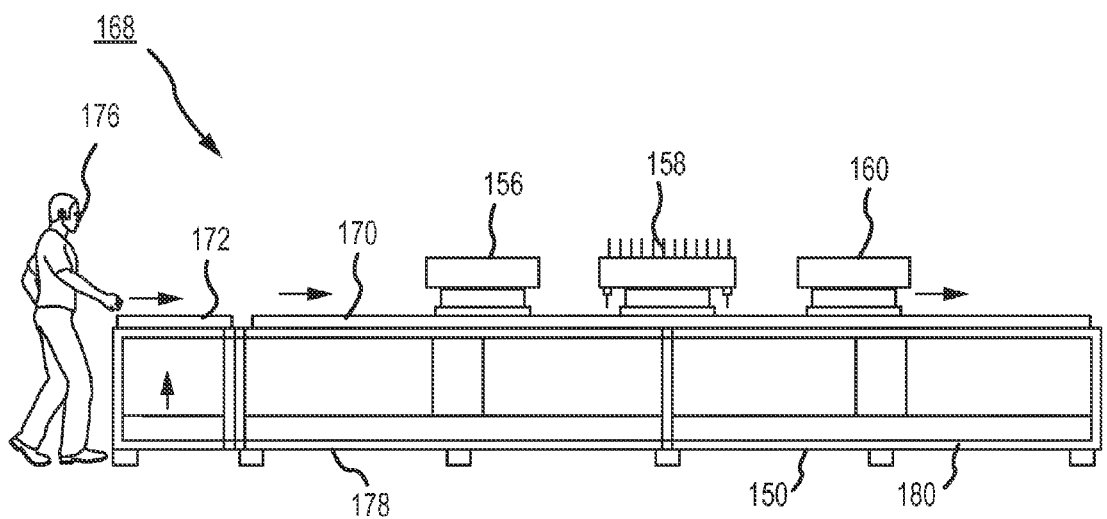
Figure 8:
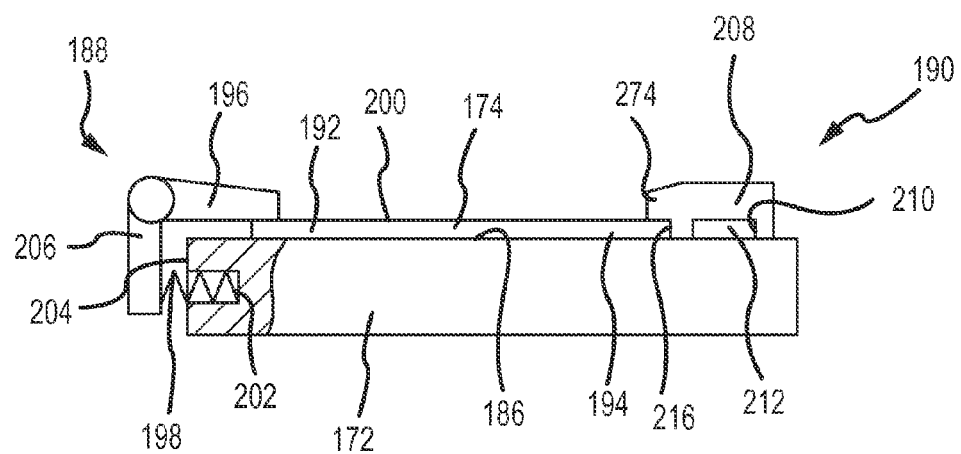

Preferred embodiments of the invention will be explained in more detail in the following text with reference to schematic illustrations, in which:

FIG. 1 shows a view of a first laying apparatus according to the invention,

FIG. 1a shows a detail of the ultrasound horn from FIG. 1, with an external cooling device, FIG. 1b shows a view of a second laying apparatus according to the invention, FIG. 2 shows a view of a contact-making apparatus according to the invention, FIG. 3 shows a movement system according to the invention, for movement of a laying and a contact-making apparatus, FIG. 4 shows a combination of a second laying apparatus according to the invention with the contact-making apparatus as shown in FIG. 2, FIG. 5 shows a plan view of a production installation according to the invention, FIG. 6 shows a plan view of a second embodiment of a production installation according to the invention, FIG. 7 shows a side view of the production installation shown in FIG. 6, and FIG. 8 shows a side view of a carriage from FIG. 6 with preferred clamping devices.

As can be seen from FIG. 1, one embodiment of a laying apparatus 2 according to the invention for laying of an insulated wire 4 has an ultrasound converter 10, which is held in a tubular housing 8, and an ultrasound horn 12, as an antenna on a substrate 6 for production of a transponder unit, for example for smart cards or for laying antennas in mobile telephone housings. According to the invention, the wire is supplied axially to the laying apparatus 2. A coaxial wire guide in the form of a passage channel, which is composed of a plurality of individual holes 14, 15, 44, 54, is provided for guidance of the wire 4 in the laying apparatus 2.

The ultrasound converter 10 is used to apply ultrasound oscillations in the range up to about 60 kHz to the ultrasound horn 12 and thus to the wire 4. It has a cylindrical body through which a passage hole 14 passes, which is coaxial with respect to the longitudinal axis of the ultrasound horn 12, in order to hold the wire 4. It has two annular shoulders 17, 19 at the end, which enter two recesses 22, 24 at the end of the housing 8, with an annular space 16 being formed between its outer circumferential wall 25 and an opposite inner circumferential wall 27 of the housing 8.

The annular space 16 is axially bounded by annular shoulder surfaces 16, 18 of the annular shoulders 17, 19 and is sealed in the circumferential direction via a sealing ring 26, which enters an annular groove on the end face of the recess 20 and rests axially on the annular shoulder surface 18, as well as via a sealing ring 26, which enters an internal circumferential groove in the housing 8 and rests on a section of the outer circumferential wall 25 of the ultrasound converter 10. Its second annular shoulder surface 20 runs flat on an opposite bottom surface 28 of the recess 20. There is preferably a radial clearance of about 20 μm, and an axial clearance of about 100 μm between the ultrasound converter 10 and the housing 8.

A gaseous or liquid medium can be introduced into the annular space 16 via a transverse hole 24 with an internal thread, so that the ultrasound converter 10 is mounted in a floating manner and, during operation, can carry out both rotary movements and axial movements as a result of the ultrasound oscillations that are produced. Compressed air is preferably blown into the annular space 14 at a pressure of about 6 bar.

The ultrasound converter 10 is connected to a cylindrical shaft 38 of the ultrasound horn 12 via an end-face converter horn 36, which is stepped back radially. The converter horn 36 is preferably screwed to the ultrasound converter 10 and has an axial hole 15 which is coaxial with respect to the longitudinal axis of the ultrasound horn 12. The converter horn 36 is likewise screwed to the shaft 38 of the ultrasound horn 12. As indicated in FIG. 1, it also has an end-face centering recess 40, in which a centering projection 41 on the ultrasound horn 12 engages. The centering has the advantage that the axial hole 15 in the shaft 36 is positioned precisely coaxially with respect to the longitudinal axis of the ultrasound horn 12.

The shaft 38 merges into a conical head area 42 of the ultrasound horn 12. A passage hole 44 is formed coaxially with respect to the longitudinal axis in the ultrasound horn 12, and extends from the centering projection 41 to an end-face outlet opening 46 in the head area 42. In order to guide the wire 4 better, the passage hole 44 is tapered radially in the area of the outlet opening 46. The passage hole 44 preferably has a diameter of 300 μm over an axial length A of about 2 mm to 3 mm, seen from the outlet opening 46.

A bearing device 48 is arranged on the opposite end surface of the ultrasound converter 10 to the ultrasound horn 12. The bearing device 48 has two cylindrical half-bodies 50, 52. The half-bodies 50, 52 are connected to one another on their end faces such that an internal area 54 with an approximately diamond-shaped longitudinal cross section is in each case formed by a conical recess, which passes axially through the half-body 50, 52, in conjunction with the other recess. In this case, the conical recess in the upper half-body 50 shown in FIG. 1 has an inlet opening 58 for the wire 4.

In the laying apparatus 2, the wire guide comprises the internal area 54, the passage hole 14, the axial hole and the longitudinal hole 44. In consequence, a passage channel passes through the laying apparatus 2 coaxially with respect to the longitudinal axis of the ultrasound horn 12. The passage channel preferably has a diameter of 3 mm, which as described above, is reduced to about 300 μm in the head area 42 of the ultrasound horn 12. In this case, in particular, the end-face arrangement of the inlet opening 56 allows the wire 4 to be supplied axially.

A gaseous medium, which is used for low-friction guidance of the wire 4, can flow via radial holes 58, 60 and/or a hole star into the internal area 54, and thus into the wire guide. Compressed air is preferably used, so that the wire 4 is guided with virtually no friction by means of aerostatic bearing in the wire guide. In this case, the tapering area in the passage hole 44 through the ultrasound horn 12 results in a ram-air pressure building up in the area of the outlet opening 46, and this improves the guidance.

The compressed air can be preheated in order to shorten the cycle time for laying. The preferred temperature range is about 50° C. to 60° C. The preheating process heats, in particular, the insulation on the wire 4, so that the connection to the substrate 6 can be made more quickly.

A feed device 62 is provided for supplying the wire 4 and for threading it into the inlet opening 56. The feed device 62 essentially has two grippers 64, 66, at least one of which is mounted on a holder 68 such that it can move, so that an end section of the wire 4 to be threaded in can be gripped, and can be guided specifically. The holder 68 can be moved as required with respect to the laying apparatus 2, during which process it can likewise carry out a rearward movement, if driven appropriately. The wire 4 can be conveyed automatically in steps to the outlet opening 46 by repeatedly releasing, moving back, gripping and forward movement of the feed device 62. For example, this means that it is possible to supply the free end section of the wire 4 via the laying apparatus 2 into an opening in a closed housing, and then to lay it on the housing, outside this housing.

A rearward movement is particularly advantageous in addition when the wire 4 must be cut after laying and making contact. In a situation such as this, the wire 4 can broken by a rearward movement in the area in which contact is made (see FIG. 4).

In one preferred embodiment as shown in FIG. 1b, the ultrasound converter 10 is arranged offset in the radial direction in the housing 8, so that the passage channel, which is formed from the individual holes 14, 15, 44 and 54, runs eccentrically with respect to the housing longitudinal axis G, and the outlet opening 46 is arranged radially offset, by an offset V, with respect to the housing longitudinal axis G. In this case, the wire 4 is supplied via the feed device 62 coaxially with respect to the longitudinal axis L of the passage channel, so that it is guided "centrally" in the passage channel. The offset V between the housing longitudinal axis G and the longitudinal axis L of the passage channel is preferably about 0.5 mm.

The eccentric alignment of the passage channel with respect to the housing longitudinal axis G has the advantage that the outlet opening 46 of the ultrasound horn 12 can be moved relative to the housing 8 by rotation of the ultrasound converter 10 about its longitudinal axis. In particular, this means that it is possible to produce a plurality of transponding units at the same time and to adjust the position of the laying apparatuses 22 relative to one another when there are a large number of identical laying apparatuses. For example, this means that it is feasible to arrange twelve laying apparatuses 22 in one console or station (see FIGS. 5, 6 and 7), which is still to be explained in the following text, with in each case six laying apparatuses 22 being arranged one behind the other in the feed direction (fixed direction), and in each case two laying apparatuses 22 being arranged transversely with respect to the feed direction (y direction). The six laying apparatuses 22 are each guided via their housing 4 in a common groove, which extends in the x direction. In other words, the console has two grooves which run in the x direction, and in each of which six laying apparatuses 22 are arranged above their housing 4. The laying apparatuses 22 can be moved freely in the groove, and can be fixed, in order to adjust the distances between the respective laying apparatuses 22, which are mounted in one of the grooves, in the x direction. According to the invention, in order to adjust the laying apparatuses 22 in one of the grooves in the y direction relative to one another, the ultrasound converters 10 are, according to the invention, rotated in their respective housing 8 until the eccentricity of the longitudinal axis L of the passage channel with respect to the housing longitudinal axis results in the outlet openings 46 being arranged optimally relative to one another in the y direction.

Furthermore, the laying apparatus illustrated in FIG. 1b has a transverse hole 43 in the head area 42 of the ultrasound horn 12, which transverse hole 43 opens into the longitudinal hole 44 and into which a sleeve 45 is inserted through which an optical waveguide or a glass fiber 47 is passed, which is connected to a power source (not illustrated), such as a laser. The laser light is passed via the glass fiber 47 to the wire 4 in the longitudinal hole 44, as a result of which this wire 4 is heated, and its insulation vaporizes away in a defined manner, so that the wire 4 emerges from the outlet opening 46 as a bare copper wire and can be embedded in the substrate 6 or, as is still to be explained in the following text (see FIGS. 2, 3 and 4), can make contact with connecting pads on a chip or contact surfaces on a chip module by means of thermocompression welding without any risk of contamination being introduced through the insulation during laying or the contact-making process, since this has already been removed. The transverse hole 43 preferably has a diameter of 2.6 mm.

It is likewise feasible for heated air to be blown into the longitudinal hole 44 through the transverse hole 43 or the sleeve 45, in order to remove the insulation from the wire 4.

As shown in FIG. 1a, a cooling device 182 can be provided in order to prevent overheating of the wire 4 that is to be laid. The cooling device 182 has a nozzle which is connected to the compressed-air supply for the aerostatic bearing device 48 for the laying device 2. The nozzle is arranged adjacent to the head area 42 of the ultrasound horn 12 in such a manner that the wire 4 which emerges from the longitudinal hole 44 or from the outlet opening 46 can have compressed air flowing around it. Cooling with compressed air has the advantage that this is already guided as far as the laying device 2 as a result of the air guidance of the wire 4 so that there is no need for any complex separate supply. However, of course, it is also possible to use other gases as the cooling medium.

FIG. 2 shows a contact-making apparatus 70 according to the invention in order to make contact between a wire and a chip by means of the application of temperature and pressure. The contact-making apparatus 70 may, of course, also be used to make contact between a wire and a substrate. This contact-making apparatus has a clamping arrangement 72 for clamping a thermode 74, with a stationary and a moveable clamping jaw 76, 78, whose head sections 80, 82 are prestressed with respect to one another via a spring 84, in order to clamp the thermode 74.

Contact is made by passing current through the clamping arrangement 72, with the resistance being at its maximum in the area of the thermode tip 75, so that this is heated and, when the thermode tip 75 is pressed down onto the wire, heats the latter, deforms it, and connects it to the chip.

In order to hold the thermode 74, the head section 80 of the stationary clamping jaw 76 has an axial depression 86 with a corresponding shape to that of the thermode 74. The head section 82 of the moveable clamping jaw 78 has a correspondingly shaped projection 88, which is shortened axially. When adjusted correctly, the thermode tip 75 of the thermode 74 projects axially beyond the depression 86 and the projection 88.

A blind hole 94, 96, on whose base surfaces the spring 84 is supported, is in each case formed, in order to hold the spring 84, in the jaw sections 90, 92 (which are adjacent to the head sections 80, 82) of the clamping jaws 76, 78.

The head section 82 of the moveable clamping jaw 78 can pivot about a pivoting axis 98, so that the thermode 74 is automatically clamped between the clamping jaws 76, 78. A wedge element 100, which can be moved in the longitudinal direction of the thermode 74, is provided in order to release the clamp. This has a wedge surface 102, by means which it can be moved into contact with a correspondingly shaped inclined surface 104 on the jaw section 90 of the moveable clamping jaw 78.

When the wedge element 100 is moved in the direction of the pivoting axis 98, the wedge surface 102 runs onto the inclined surface 104, as a result of which the moveable clamping jaw 78 as shown in FIG. 2 is pivoted counterclockwise about the pivoting axis 98. In consequence, the clamping of the thermode 74 is released, and the spring 84 is compressed. In order to renew the clamping, the wedge element 100 is moved back until the contact between the wedge surface 102 and the inclined surface 104 no longer exists, so that the stress is removed from the spring 84 and the thermode is clamped in. The automatic clamping of the thermode 74 thus makes it possible to automate thermode changes. Automated thermode changes can be carried out particularly easily if the thermodes 74 are kept available in a magazine, which can be driven by the contact-making apparatus 70.

At least one gas channel 106, 108 for the supply of inert gas is formed in each of the clamping jaws 76, 78. A cup-like suction shroud 110 is provided in order to suck the inert gas away. The suction shroud 110 has a coaxial opening 112 in its base plate, through which the head sections of the clamping jaws 76, 78 can enter the area inside the suction shroud 112. The suction shroud 110 has the advantage that the toxic gas which is created when contact is being made, such as hydrochloric acid, is sucked away. The gas channels 106, 108 extend at least in places in the longitudinal direction of the contact-making apparatus 70, and emerge concentrically with respect to the thermode 74, close to the thermode tip 75. In this case, the effect of the inert gas in principle becomes better the closer the gas can flow along the thermode tip 75 in the axial direction. The head sections 80, 82 advantageously have chamfered outer surfaces 114, 116, with the gas channels 106, 108 at an axial distance of about 1 mm away from the thermode tip 75.

A valve which is not illustrated, preferably a proportional valve, is provided in order to regulate the flow of inert gas, in particular in order to allow welding without oxidation, which valve interacts with a sensor for detection of the inert gas parameters, such as the pressure or flow rate, and whose opening cross section can be adjusted in accordance with the detected parameters.

FIG. 3 shows a movement system 124 for movement of a processing apparatus, for example a laying apparatus 2 as shown in FIG. 1 or a contact-making apparatus 70 as shown in FIG. 2. A movement system 124 such as this allows linear movement of the processing apparatus in the x, y or z direction. On the basis of our understanding, the x direction corresponds to the horizontal transport direction in the longitudinal direction of a machine bed, the y direction is the horizontal direction transversely with respect to the machine bed, that is to say transversely with respect to the x direction, and the z direction corresponds to the vertical to the machine bed, that is to say the height adjustment is carried out in the z direction. If three movement systems 124 are provided, the processing apparatus can thus be moved individually in all directions.

The movement system 124 has a connection carriage 128, which is guided on a longitudinal guide 126, for connection and for movement of the processing apparatus. In this case, the processing apparatus is connected via a corresponding hole pattern 130 on the connection carriage 128. Furthermore, the movement system 124 has a drive 134 for driving the connection carriage 128, which is arranged on a base plate 132, which is formed separately from the longitudinal guide 126.

The drive 134 is in the form of a piezo-motor, that is to say a piezo-leg motor, by means of which the connection carriage 128 can be moved in the longitudinal direction. The drive 134 has a large number of fingers 136 or legs, the so-called piezo-legs, which follow an S-shaped path, ideally a sinusoidal path, where current is passed via the drive 134. In this case, one finger 136 in each case acts on the front face of a slide 138, which is thus moved linearly.

The slide 138 is preferably produced from ceramic. In order to prevent deformation of the slide 138 when pressure is applied with one of the fingers 136, its rear face rests on a guide shoulder 140 in the area of the drive 134. It is attached by a free end section, which is located at a distance from the drive 134, to a guide carriage 142, which runs in a longitudinal guide 144.

The guide carriage 142 is connected to the connection carriage, so that the longitudinal movements which are transmitted from the slide 138 to the guide carriage 142 are passed on to the connection carriage 138, and thus to the processing apparatus.

The carriages 138, 142 are preferably connected to one another via a load gauge 146.

The load gauge 146 is preferably in the form of a force gauge, and is used to measure the movement parameters, such as the movement force. In the case of movement systems 124, it is preferably provided in the z direction and is designed in such a manner that it likewise has damping characteristics. By way of example, known strain-gauge sensors can be used for this purpose. These sensors generally have an E-shaped geometry, with a pressure sensor for measurement of the pressure that is developed by the drive 134 and is transmitted by the slide 138 being arranged on the central leg of the E. The two outer legs of the E allow deformation, and thus damping, preferably in the movement range of about 100 µm, so that it is possible to compensate for certain force overshoots.

This means that there is no need for additional damping elements such as compression springs between the carriages 138, 146. The lack of damping elements such as these has the advantage that no disturbing oscillations are introduced into the processing apparatus, and the high dynamics of the piezo-motor 134 can be transmitted, virtually unfiltered, to the connection carriage 128. In consequence, corrections can be made to a laying process and/or contact-making process quickly and directly, so that it is possible to comply with particularly narrow manufacturing tolerances.

FIG. 4 shows a laying and contact-making unit 117 with a laying apparatus 119 and a contact-making apparatus 70 for production of a transponder unit by means of direct contact. In the case of direct contact, a wire 4 makes direct contact with connecting pads on a chip, and this requires particularly high degrees of accuracy.

This means that there is no need for the normal chip modules in order to enlarge the connecting pads of the chip. However, of course, a combination of the contact-making apparatus 70 with the laying apparatus 2 described with reference to FIG. 1 is also feasible.

In principle, the laying apparatus 118 as shown in FIG. 4, and in the same way as the laying apparatus 2 described above as shown in FIG. 1, is provided with an axial supply of a wire 4 and a coaxial wire guide, a conically tapering ultrasound horn 119, an aerostatic bearing device 48 and a gripper-like feed device 62 for supplying and threading the wire 4 into the passage channel.

The major difference from the laying apparatus 2 shown in FIG. 1 is that an ultrasound converter 120 is attached to the ultrasound horn 119 at the side rather than coaxially. The ultrasound converter 120 is effectively offset laterally with respect to the longitudinal axis of the ultrasound horn 119, so that ultrasound oscillations are introduced into the ultrasound horn 119 horizontally, that is to say in the transverse direction with respect to its longitudinal axis and thus parallel to the laying plane of the wire 4, and the wire 4 is thus "rubbed" into the substrate by the application of horizontal oscillations.

The bearing device 48 is attached to the end of the shaft 123 of the ultrasound horn 119, so that, in consequence, the axial wire guide does not extend through the ultrasound converter 120.

The ultrasound device 120 at the side has a converter horn 122 which is screwed to a narrow face, and with which it clasps the lengthened shaft 123 of the ultrasound horn 119, clamping it. The clamping action can be produced, for example, by the converter horn 120 being in the form of an axially slotted ring, which can be arranged with a force fit on the shaft 123, by means of clamping screws.

The ultrasound converter 120 is held in a floating manner, for example by means of the air bearing as described above, in a holding element which is not illustrated and which supports the entire laying apparatus 117. The ultrasound converter 120 and the ultrasound horn 112 can thus carry out free movements during operation. The arrangement of the ultrasound converter 120 at the side allows it and the ultrasound horn 119 to be designed to be even smaller and with an even greater reduction in weight, thus allowing even higher ultrasound frequencies, for example beyond 100 kHz. In a situation such as this, the ultrasound horn 119 has a maximum amplitude in the transverse direction of about 10 μm in the area of the outlet opening 46 of the passage channel. New processing methods such as the direct contact-making method according to the invention and corresponding transponder units can thus be provided.

The laying apparatus 118 and the contact-making apparatus 70 are arranged in a holder, which is not illustrated but is positioned in a central axis system. The holder can be moved in the x direction and y direction. The apparatuses 70, 118 can be moved individually in the z direction. A movement system according to the invention and as shown in FIG. 3 is preferably used in each case as the movement system, thus allowing absolutely precise and highly dynamic force movements.

In a method according to the invention for formation of a transponder unit by means of direct contact, that is to say for connection of the end sections directly to the connecting pads on a chip without the use of a chip module, a chip is positioned in a stamped-out chip window in a substrate. In order to prevent any relative position change of the chip in the chip window, it can be secured in the chip window by means of an adhesive. A wire 4 is then threaded axially into the bearing device 62 by means of the feed device 62, and is thus supplied to the ultrasound horn 12. Heated compressed air is blown into the air bearing device 48 in order to lay the wire 4, and the ultrasound converter 120 is driven, preferably at about 100 kHz, so that the ultrasound horn 119 has horizontal ultrasound oscillation supplied to it, and the wire 4 is "rubbed" into the substrate. The free end section of the wire 4 is fixed, and the wire is guided over a first connecting pad on the chip. After crossing over the first connecting pad, the contact-making apparatus 70 is driven, and the wire 4 is welded to the connecting pad. The process of laying the wire 4 with the application of ultrasound is continued until the desired number of wire windings or the wire coil have or has been laid. Finally, the wire 4 is guided over the laid windings and over a second connecting pad on the chip. No short circuit can occur during this process, because of the insulation on the wire 4 as it crosses over the already laid windings. The contact-making apparatus 70 is driven once again in order to make contact between the wire 4 and the second connecting pad. By pressing down the wire 4 during the welding process with the thermode tip 75, the wire is heated, deformed, and is thus welded to the second connecting pad. In order to break the wire after it has been successfully laid and welded, the thermode tip 75 is kept pressed down on the wire 4. The feed device 62 then grips the wire 4 and carries out a rearward movement, so that the wire 4 is loaded in tension, and is broken in the area of the deformation by the thermode tip 75, that is to say in the area of the weld. The transponder unit is thus complete, and can be removed from the laying and contact-making unit 117.

The application of ultrasound to the wire 4 can optionally be stopped when crossing the laid wire windings or when crossing over the connecting pads.

Throughout the entire process, the individual laying and contact-making steps are monitored by an optical monitoring device. In the event of unacceptable actual discrepancies from the nominal discrepancies, the movement systems are driven in an appropriate manner such that the unacceptable actual discrepancies are corrected, or are prevented from the start by immediate readjustment.

FIG. 5 shows a production installation 148 according to the invention, for production of a large number of transponder units.

The production installation 148 has a machine bed 150 for transport of a blank 152. The blank 152 is moved cyclically by gripping devices 154, for example on a 10 s cycle to individual processing stations which are arranged on consoles 156, 158, 160. Only three consoles 156, 158, 160 are illustrated, by way of example, in FIG. 5.

The consoles 156, 158, 160 are arranged on one longitudinal side of the machine bed 150. An operator thus has a free view of and free access to the processing stations from the opposite longitudinal side of the machine bed 150. The consoles 156, 158, 160 are in the form of cruciform slots, so that they can be moved individually in the x direction and in the y direction. In this case, they can be moved in the y direction in such a manner that it is possible to move over the entire width of the blank 152. The movement can be carried out, for example, via spindle drives, which are connected to corresponding cruciform slots, which are mounted in the longitudinal guide.

Processing stations which can be used for this purpose include, for example, a stapling station for stapling a carrier web to a film in which chip windows are incorporated, to the blank, a placement station for fitting chips to the blank, a laying station for laying wires on the blank, and a contact-making station for making contact between the wires and the chips. In this case, the individual processing stations comprise a large number of stapling apparatuses, placement apparatuses, laying apparatuses 2 as shown in FIG. 1 and contact-making apparatuses 70 as shown in FIG. 2.

The individual apparatuses are in each case arranged flat alongside one another and one behind the other, that is to say in the x direction and in the y direction, on the consoles 156, 158, 160, thus allowing high productivity to be achieved. For example, this makes it possible to arrange ten apparatuses on each console 156, 158, 160.

The apparatuses are moved individually in the z direction, in each case via a single associated movement system as shown in FIG. 3.

A film stamping station 160 for stamping chip windows is arranged at the input on the machine bed 150 and is preferably a window stamp which can be moved in the x direction, thus preventing distortion and making it possible to achieve very high accuracies.

A conventional module stamping station 164, for stamping the chips with the chip modules from a transport unit that has been delivered is arranged on the machine bed 150 opposite the console 158 for holding the placement station.

Furthermore, a cutting station 166 for cutting the blank 152 into processing units which can be handled for simplified further processing, for example lamination, is arranged on the machine bed 150. The cutting station 166 has an ultrasound gauge and is freely programmable, that is to say the cutting station 166 can carry out roll-sheet and roll-roll processing, without conversion.

In order to produce a transponder unit, a film is passed through the film stamping station 162, in which the chip windows for holding the chips with the chip modules are stamped out. After the stamping process, the film is supplied to the stapling console 156. At the same time, a carrier web is passed under the film stamping station 162 to the stapling console 156. In the stapling console 156, the film and the carrier web are stapled together to form a blank 150, and are passed on to the placement console 158. In the placement console 158, the chips which have been stamped out by the module stamping station 164 are inserted, with the chip modules, into the chip windows. The wire windings are then laid on the blank 152 in the laying console 160, and are connected to the chips in the contact-making console, which is not illustrated. Finally, a protective film is supplied, and is stapled to the blank 152. In the cutting station 166, the blank 152 is then cut into a large number of processing units which can be handled, and is taken from the machine bed 148, for example for lamination.

In the case of the direct contact-making method as described with reference to FIG. 4, the laying console 160 and the contact-making console can be combined to form a single console by the use of the laying and contact-making unit as shown in FIG. 4, so that the four consoles are reduced in a corresponding manner by a factor of 1 to three consoles. Furthermore, it should be noted that the module stamping station 164 then does not stamp out the chips with the chip modules, but only the chips, since there is no need for the chip modules, as described with reference to FIG. 4. Appropriate adaptation is required to the film stamping station 162, in order to reduce the area to be stamped out for the chip windows.

Depending on the material of the film, in order to improve the adhesion of the wire windings to the film, it may be advantageous to provide the film with a coating before the laying of the wire. The coating makes it possible to use materials for laying the wire windings which are suitable only to a limited extent, because of their poor laying characteristics. One example of a material such as this is Treslin®, which is known for its very good weathering, temperature and moisture resistance, but allows only poor adhesion of the wire windings. When a corresponding coating is applied, the adhesion can, however, be improved such that very good wire laying can be achieved even with films composed of this material.

The coating may be applied to the film over the entire area or in specific areas, for example to the areas in which the wires are introduced. By way of example, the coating thickness may be about 30 μm. The coating material preferably cures when subjected to ultraviolet light. One example of a coating material is polyethylene. The coating is applied in a coating station 163, for example by a spraying technique, painting technique, wiping technique, screen printing, tampon printing or a metering technique as shown in the illustration of FIG. 5, after the window stamping station 162 and before the stapling station 156. However, depending on the chosen coating technique, it is also feasible to arrange the coating station 163 between the stapling console 156 and the placement console 158.

In order to cure the coating, it is advantageous for the blanks 150 which have been stapled together to pass through a buffer zone, for example in the form of a U-shaped sheet, before the placement console 158, and before being supplied to the placement console 158.

FIGS. 6 and 7 show a second embodiment of a production installation 168 according to the invention. As in the case of the already described production installation 148 shown in FIG. 5, consoles 156, 158, 160 for holding the processing stations according to the invention are arranged on one side of a machine bed 150. The consoles 156, 158, 160 are designed in the same way and have the same movement capabilities in the x, y and z directions as those in the production installation 148 shown in FIG. 5, so that they will not be explained again in this context, but reference is made to the above explanatory notes.

One major feature of this production installation 168 is that a large number of transponder units 184 are manufactured from individual sheets 174, which are placed manually on carriages 172 and pass through the individual consoles 156, 158, 160, with the sheet 174 being passed back to the initial position after processing, where they are manually removed from the carriage 172. This means that the sheets 174 are guided in a circle, being placed on the respective carriage 172, or its contact surface 186, and being removed from the respective carriage 172 manually by an operator 176. The arrows in FIG. 7 indicate this type of circular movement of the sheets 174. The manual handling of the sheets 174 means that this production installation 168 is particularly suitable for individual small batches. For example, sixteen transponder units 184 can be manufactured from one sheet 172, as in the case of the right-hand sheet 172 in FIG. 6.

The carriages 172 for holding the sheets 174 to be populated are mounted on the machine bed 150 such that they can be moved above a supply 170. In the present embodiment, the sheets 174 are prepared in such a manner that they already have windows for holding one chip each. The operator 176 manually places the sheets 174 on the respective carriages 172 at the initial position, and the sheets are moved via the carriages 172 successively to the individual consoles 156, 158, 160. As shown in the illustration in FIGS. 6 and 7, the carriages 172 are in this case moved from left to right. For example, the chips for the transponder units 184 can be placed in the windows at the first console 156, the wires 4 can be laid on the transponder units 184 at the second console 158, and the ends of the wires 4 can be connected to the respective chip at the third console 160. A protective film can be applied manually by the operator 176 after the sheets 174 have been returned to the initial position, and after the operator 176 has removed the sheets 174.

A return guide 178 is provided in order to return the populated sheets 174 to the operator 176, that is to say in order to move the carriages 172 from right to left as shown in the illustrations in FIGS. 6 and 7, and this return guide 178 preferably runs under the supply 170 in an internal area 180 of the machine bed 150, as shown in FIG. 7. The return guide 178 is connected to the supply 170 via in each case one lifting device, which is not illustrated, at the end for raising and lowering the carriages 172.

When a carriage 172 is being lowered, after it has passed through the consoles 156, 158, 160, it is transferred with the populated sheet 172 from the right-hand end area of the supply 170 as shown in FIG. 7 to the return guide 178. On raising, this carriage 172 is moved back from the left-hand end area of the return guide 178, as shown in FIG. 7, to its initial position close to the operator 176, so that the operator 176 can remove the populated sheet 174 from the raised carriage 172 and can then place a new sheet 174 to be processed on this carriage 172, which is then free, and this new sheet 174 can then be supplied above the supply 170 to the individual consoles 156, 158, 160.

In order to prevent the sheet 174 from sliding on the contact surface of the carriage 172, a mechanical clamping device 188 and a magnetic clamping device 190 can be provided as shown in FIG. 8, by means of which the sheet 174 can be detachably clamped on the contact surface 186 of the carriage 172 on edge areas 192, 194, which are at a distance from one another and extend in the supply direction.

The mechanical clamping device 188 has a clamping jaw 196 which is mounted on the carriage 172 such that it can rotate and is prestressed in the clamping position against the surface 200 of the sheet 174 by means of a prestressing spring 198. The prestressing spring 198 is held in places in a recess 202 on a narrow face 204 of the carriage 172, and acts on a rotating limb 206, which is connected to the clamping jaw 196.

In order to place a sheet 174 on the carriage 172, or to remove a sheet from the carriage 172, the operator 176 can actuate an opening mechanism (which is not illustrated), preferably a pneumatic cylinder, in such a manner that, as shown in the view in FIG. 8, the clamping jaw 196 rotates in the counterclockwise sense against the prestressing force of the prestressing spring 198, so that the clamping jaw 196 is separated from the contact surface 186 of the carriage and from the surface 200 of the sheet 174. The opening mechanism may, of course, be in a different form, for example being operated hydraulically, by an electric motor or motors, or electromagnetically.

The magnetic clamping device 190 has a clamping strip 208 which can be handled by the operator 186 and in which a cavity 210 is formed to hold a magnetic strip 212. A projection 214 is provided on the edge area 194 of the sheet 174 in order to clamp it, and is at a distance from the contact surface of the carriage 172 when the clamping strip 208 is being placed on this contact surface, thus resulting in the formation of a holding pocket 216 for holding the edge area 194. The clamping strip 208 can move freely on the carriage 172, which can be appropriately magnetized, and is held in its instantaneous position only by the magnetic force of the magnetic strip 212. The free position of the clamping strip 208 on the carriage 172 means that sheets 174 of different dimensions can be securely but detachably clamped on the carriage 172.

A laying apparatus is disclosed for the laying of wire windings for transponder units with an axial wire supply to the laying apparatus, a contact-making apparatus for making contact between the wires and an automatic thermode clamping arrangement, a movement system for movement of processing apparatuses with a piezo-leg motor, a production installation for production of transponder units of a console type, a method for production of transponder units with horizontal introduction of ultrasound, and a transponder unit in which the wire ends act directly on the connecting pads on the chip.

| List of reference symbols ||
|---|---|
| 2 | Laying apparatus |
| 4 | Wire |
| 6 | Substrate |
| 8 | Housing |
| 10 | Ultrasound converter |
| 12 | Ultrasound horn |
| 14 | Passage hole |
| 15 | Axial hole |
| 16 | Annular space |
| 17 | Annular shoulder |

| List of reference symbols — continued ||
|---|---|
| 18 | Annular shoulder surface |
| 19 | Annular shoulder |
| 20 | Annular shoulder surface |
| 22 | Recess |
| 24 | Recess |
| 25 | External circumferential wall |
| 26 | Sealing ring |
| 27 | Internal circumferential wall |
| 28 | Circumferential surface |
| 30 | Sealing ring |
| 32 | Bottom surface |
| 34 | Transverse hole |
| 36 | Converter horn |
| 38 | Shaft |
| 40 | Centering recess |
| 41 | Centering projection |
| 42 | Head area |
| 43 | Transverse hole |
| 44 | Longitudinal hole |
| 45 | Sleeve |
| 46 | Outlet opening |
| 47 | Glass fiber |
| 48 | Bearing device |
| 50 | Half-body |
| 52 | Half-body |
| 54 | Internal area |
| 56 | Inlet opening |
| 58 | Radial hole |
| 60 | Radial hole |
| 62 | Feed device |
| 64 | Gripper |
| 66 | Gripper |
| 68 | Holder |
| 70 | Contact-making apparatus |
| 72 | Clamping arrangement |
| 74 | Thermode |
| 75 | Thermode tip |
| 76 | Stationary clamping jaw |
| 78 | Moveable clamping jaw |
| 80 | Head section |
| 82 | Head section |
| 84 | Spring |
| 86 | Depression |
| 88 | Projection |
| 90 | Jaw section |
| 92 | Jaw section |
| 94 | Blind hole |
| 96 | Blind hole |
| 98 | Pivoting axis |
| 100 | Wedge element |
| 102 | Wedge surface |
| 104 | Inclined surface |
| 106 | Gas channel |
| 108 | Gas channel |
| 110 | Suction shroud |
| 112 | Opening |
| 114 | Outer surface |
| 116 | Outer surface |
| 117 | Laying and contact-making unit |
| 118 | Laying apparatus |
| 119 | Ultrasound horn |
| 120 | Ultrasound converter |
| 122 | Attachment body |
| 123 | Shaft |
| 124 | Movement system |
| 126 | Longitudinal guide |
| 128 | Connection carriage |
| 130 | Hole pattern |
| 132 | Base plate |
| 134 | Drive |
| 136 | Finger |
| 138 | Slide |
| 140 | Guide shoulder |
| 142 | Guide carriage |
| 144 | Longitudinal guide |
| 146 | Load gauge |
| 148 | Production installation |
| 150 | Machine bed |

List of reference symbols -continued

| | |
|---|---|
| 152 | Blank |
| 154 | Gripping device |
| 156 | Console |
| 158 | Console |
| 160 | Console |
| 162 | Film stamping station |
| 163 | Coating station |
| 164 | Module stamping station |
| 166 | Cutting station |
| 168 | Production installation |
| 170 | Supply |
| 172 | Carriage |
| 174 | Sheet |
| 176 | Operator |
| 178 | Return guide |
| 180 | Internal area |
| 182 | Cooling device |
| 184 | Transponder unit |
| 186 | Contact surface |
| 188 | Mechanical clamping device |
| 190 | Magnetic clamping device |
| 192 | Edge area |
| 194 | Edge area |
| 196 | Clamping jaw |
| 200 | Prestressing spring |
| 202 | Surface |
| 204 | Recess |
| 206 | Rotating limb |
| 208 | Clamping strip |
| 210 | Cavity |
| 212 | Magnetic strip |
| 214 | Projection |
| 216 | Holding pocket |

The invention claimed is:

1. Feed device for taking up and guiding a tool device, in particular a laying apparatus for laying a wire on a substrate and/or a contacting device for contacting the wire with a chip, comprising:

a guide carriage being movable in a first direction by means of a drive along a first guide having a first longitudinal axis substantially parallel to the first direction; and a connection carriage for taking up the tool device, the connection carriage being movable in the first direction along a second guide having a second longitudinal axis substantially parallel to the first direction, wherein the first and second longitudinal axes are the same, whereby the guide carriage and the connection carriage are mechanically coupled together by a load gauge, in particular a force gauge, and is such that the displacement of the guide carriage along the first guide is substantially equivalent to the movement of the connection carriage along the second guide.

2. Feed device according to claim 1, wherein the load gauge is a strain-gauge sensor.

3. Feed device according to claim 1, wherein the drive is a piezoelectric drive.

4. Feed device according to claim 2, wherein the piezoelectric drive is a piezo-leg drive, wherein at least one finger is piezoelectrically activated in order to move a ceramic plate slide being coupled to the guide carriage and so move the guide carriage along the first guide.

5. Feed device according to claim 1, wherein the first guide and the second guide are one single guide.

6. Feed device according to claim 1, wherein the load gauge has damping characteristics and compensates for overshooting of the drive by approximately 100 μm in the longitudinal direction.

7. Feed device according to claim 1, wherein the load gauge is used to measure the pressure applied on the tool device and transmitted to the connection carriage, so that a control system for the drive can be acted on for regulation purposes.

* * * * *